United States Patent
He et al.

(10) Patent No.: US 9,576,852 B2
(45) Date of Patent: Feb. 21, 2017

(54) INTEGRATED CIRCUITS WITH SELF ALIGNED CONTACTS AND METHODS OF MANUFACTURING THE SAME

(71) Applicants: GLOBALFOUNDRIES, INC., Grand Cayman (KY); STMicroelectronics, Inc., Coppell, TX (US); International Business Machines Corporation, Armonk, NY (US)

(72) Inventors: Ming He, Menands, NY (US); Seowoo Nam, Delmar, NY (US); Yann Mignot, Slingerlands, NY (US); Jim Kelly, Schenectady, NY (US); Raghuveer Patlotta, Guilderland, NY (US); Theodorus Standaert, Clifton Park, NY (US)

(73) Assignees: GLOBALFOUNDRIES, INC., Grand Cayman (KY); STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/751,380

(22) Filed: Jun. 26, 2015

(65) Prior Publication Data
US 2016/0379881 A1    Dec. 29, 2016

(51) Int. Cl.
| H01L 21/76 | (2006.01) |
| H01L 21/768 | (2006.01) |
| H01L 21/02 | (2006.01) |
| H01L 23/528 | (2006.01) |

(52) U.S. Cl.
CPC ..... *H01L 21/76897* (2013.01); *H01L 21/0217* (2013.01); *H01L 21/76832* (2013.01); *H01L 21/76877* (2013.01); *H01L 21/76883* (2013.01); *H01L 23/528* (2013.01)

(58) Field of Classification Search
None
See application file for complete search history.

(56) References Cited

U.S. PATENT DOCUMENTS

| 2004/0155342 A1* | 8/2004 | Usami | H01L 21/76801 257/751 |
| 2013/0175583 A1* | 7/2013 | Yuan | H01L 23/485 257/288 |
| 2014/0024220 A1 | 1/2014 | Chang et al. | |

* cited by examiner

*Primary Examiner* — Charles Garber
*Assistant Examiner* — Alia Sabur
(74) *Attorney, Agent, or Firm* — Lorenz & Kopf, LLP

(57) ABSTRACT

Integrated circuits and methods for producing the same are provided. A method for producing an integrated circuit includes forming an interconnect in a first interlayer dielectric. A first cap is formed overlying the first interlayer dielectric adjacent to the interconnect, and a second interlayer dielectric is formed overlying the first interlayer dielectric, the interconnect, and the cap. A contact is formed through the second interlayer dielectric, where the contact includes an overlap region and a connection region. The overlap region directly overlies the first interlayer dielectric adjacent to the interconnect, and the connection region directly contacts the interconnect. The first cap is positioned between the overlap region and the first interlayer dielectric.

20 Claims, 5 Drawing Sheets

INTEGRATED CIRCUITS WITH SELF ALIGNED CONTACTS AND METHODS OF MANUFACTURING THE SAME

TECHNICAL FIELD

The technical field generally relates to integrated circuits with self aligned contacts and methods for manufacturing the same, and more particularly relates to integrated circuits with self aligned contacts electrically connected to an interconnect.

BACKGROUND

The majority of present day integrated circuits (ICs) are implemented by using a plurality of interconnected electronic components, such as field effect transistors (FETs), capacitors, resistors, etc. The various electronic components are typically electrically connected with interconnects. Interconnects are typically horizontal or vertical, and are often formed overlying many of the electronic components. Vertical contacts can be used to electrically connect components on different levels, such as electronic components and/or interconnects on different levels. The positioning of the vertical contact is designed to make a desired electrical connection while avoiding any undesired electrical connections.

A number of challenges arise as feature sizes of integrated circuits get smaller. For example, a contact may be designed to be electrically connected to only one of two adjacent interconnects. The amount of insulating material separating the contact and an interconnect that is not designed to be electrically connected to the contact (an electrically isolated interconnect) decreases as the feature sizes of the integrated circuit decrease. If the amount of insulating material separating the contact and the electrically isolated interconnect decreases to less than a minimum distance, there will be insufficient insulating material and a short will develop between the contact and the interconnect. Furthermore, due to the use of multiple manufacturing steps, the position of a contact may be somewhat misaligned with a desired contact position. This misalignment may result in a contact being positioned closer to an electrically isolated interconnect than designed. The closer positioning of the contact and the electrically isolated interconnect due to the misalignment increases the chances of an electrical short, especially because a short may be established through a minimum length of insulating material.

Accordingly, it is desirable to provide integrated circuits with self-aligned contacts to interconnects. In addition, it is desirable to provide integrated circuits with design features that increase the amount of insulating material between a contact and an electrically isolated interconnect. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for producing the same are provided. In an exemplary embodiment, a method for producing an integrated circuit includes forming an interconnect in a first interlayer dielectric. A first cap is formed overlying the first interlayer dielectric adjacent to the interconnect, and a second interlayer dielectric is formed overlying the first interlayer dielectric, the interconnect, and the first cap. A contact is formed through the second interlayer dielectric, where the contact includes an overlap region and a connection region. The overlap region directly overlies the first interlayer dielectric adjacent to the interconnect, and the connection region directly contacts the interconnect. The first cap is positioned between the overlap region and the first interlayer dielectric.

A method for producing an integrated circuit is provided in another embodiment. An interconnect is formed in a first interlayer dielectric, and a first cap is formed overlying the first interlayer dielectric and adjacent to the interconnect. The first cap includes a first cap material. A second cap is formed overlying the interconnect, where the second cap includes a second cap material different than the first cap material. A second interlayer dielectric is formed overlying the first and second caps, and a contact is formed through the second interlayer dielectric. The contact is electrically coupled to the interconnect.

An integrated circuit is provided in yet another embodiment. The integrated circuit includes an interconnect positioned within a first interlayer dielectric and a first cap overlying the first interlayer dielectric adjacent to the interconnect. A second interlayer dielectric overlies the first cap and the first interlayer dielectric, and a contact is positioned within the second interlayer dielectric. The contact includes an overlap region and a connection region, where the connection region is electrically coupled to the interconnect. The overlap region directly overlies the first interlayer dielectric adjacent to the interconnect, and the first cap is positioned between the overlap region and the first interlayer dielectric.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

According to various embodiments described herein, integrated circuits include interconnects formed within a first interlayer dielectric where a portion of the first interlayer dielectric is exposed between adjacent interconnects. A first cap is formed overlying the first interlayer dielectric between the adjacent interconnects, where the first cap is an insulating material. One of the interconnects is an electrically isolated interconnect, where an "electrically isolated interconnect" is defined herein as an interconnect that is intended to be electrically isolated from the described contact. A second interlayer dielectric is formed overlying the first interlayer dielectric, the first cap, and the interconnects. A vertical contact is formed through the second interlayer dielectric such that the contact is electrically connected with one or more of the interconnects, but the contact is not electrically connected to the electrically isolated interconnect. The first cap extends to a cap height greater than the height of the interconnects and the first interlayer dielectric.

As such, the first cap increases the distance between the contact and the electrically isolated interconnect.

Figure 1:
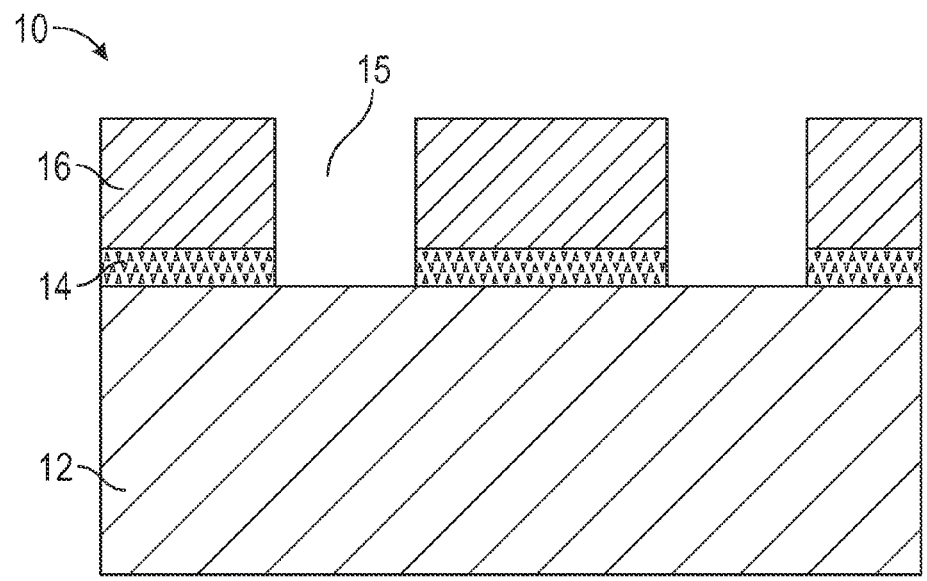
FIGS. 1-10 are cross-sectional views of portions of an integrated circuit and methods for its fabrication in accordance with exemplary embodiments.

In an exemplary embodiment illustrated in FIG. 1, an integrated circuit 10 includes a first interlayer dielectric 12. The first interlayer dielectric 12 may include silicon dioxide, organosilicate glass (OSG), porous OSG, or other electrically insulating materials. The first interlayer dielectric 12 may overlie a substrate (not illustrated) and one or more electronic components (not illustrated), such as transistors, capacitors, resistors, etc. As used herein, the term "overlying" means "over" such that an intervening layer may lie between the first interlayer dielectric 12 and the substrate, and "on" such the first interlayer dielectric 12 physically contacts the substrate. Also as used herein, the term "substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In exemplary embodiments, the substrate is a bulk monocrystalline silicon wafer or a thin layer of silicon on an insulating layer (commonly known as silicon-on-insulator or SOI) that, in turn, is supported by a carrier wafer.

In an exemplary embodiment, a hard mask 14 is formed overlying the first interlayer dielectric 12, and a interconnect photoresist 16 is formed and patterned overlying the hard mask 14. Exposed portions of the hard mask 14 are removed through photoresist gaps 15. In one example, the hard mask 14 is titanium nitride (TiN), which may be formed by chemical vapor deposition using tetramethylamidotitanium and nitrogen trifluoride at about 0.1 to about 10 torr and about 500 degrees centigrade (° C.). However, other materials may also be used. For example, the hard mask 14 may be a stack of layers, such as TiN overlying a layer of silicon dioxide, which may be deposited by chemical vapor deposition using tetraethylorthosilicate (TEOS). In another embodiment, the hard mask 14 includes a layer of silicon dioxide formed using TEOS overlying a layer of TiN which in turn overlies another layer of silicon dioxide formed using TEOS. The interconnect photoresist 16 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The interconnect photoresist 16 is patterned to form the photoresist gaps 15 by removing the desired locations with an organic solvent. The portions of the hard mask 14 exposed through the interconnect photoresist 16 are removed, such as with a wet etch using ammonium hydroxide and hydrogen peroxide in deionized water for a TiN hard mask 14. The interconnect photoresist 16 may be removed after patterning the hard mask 14, such as with an oxygen containing plasma.

Figure 2:
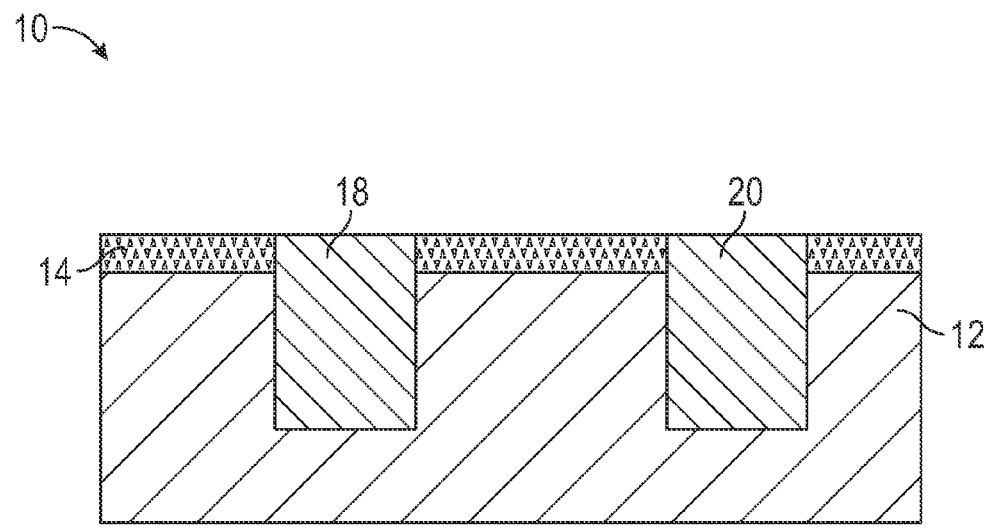

Referring to FIG. 2, with continuing reference to FIG. 1, trenches (shown filled in FIG. 2) are formed in the first interlayer dielectric 12 through the patterned hard mask 14, such as with an anisotropic etch technique. In a specific embodiment, the trenches can be formed in a silicon dioxide first interlayer dielectric 12 with a reactive ion etch using an appropriate etching gas, including but not limited to a fluorine-containing gas such as silicon hexafluoride, silicon tetrafluoride, nitrogen trifluoride, carbon tetrafluoride, or combinations thereof. Although the interconnects 18 are shown only partially extending through the first interlayer dielectric 12, it is to be appreciated that the trenches may pass completely through the first interlayer dielectric 12 and may expose an underlying surface, such as for an electrical contact or interconnect. The remaining hard mask 14 may optionally be removed after the trenches are formed, as described above, but in alternate embodiments the remaining hard mask 14 is left is place, as illustrated. The trenches can be filled with a conductive material to form interconnects 18 in the first interlayer dielectric 12. In an exemplary embodiment, the interconnects 18 are copper, which can be deposited in the trench using electroplating from a solution such as a sulfuric acid bath with a copper salt, such as copper sulfate. The overburden can then be removed, such as by chemical mechanical planarization, so the first interlayer dielectric 12 is exposed between adjacent interconnects 18. As used herein, an item is "between" two outer items if a straight line from one of the outer items to the other passes through the item there between. The interconnects 18 may also include a seed layer and/or a metallic adhesive layer (not illustrated) in some embodiments. The interconnects 18 may include other metals in alternate embodiments, such as tungsten, cobalt, or others, but the interconnects 18 are an electrically conductive material. FIG. 2 and the following FIGS. illustrate both an electrically connected interconnect 18 and an electrically isolated interconnect 20. The electrically isolated interconnect 20 is designed to be electrically isolated from a contact, as described in greater detail below. In an exemplary embodiment, a plurality of interconnects 18 are formed with a pitch of about 50 nanometers or less, where the pitch is measured from one side of one interconnect 18 to the same side of an adjacent interconnect, such as the electrically isolated interconnect 20.

Figure 3:
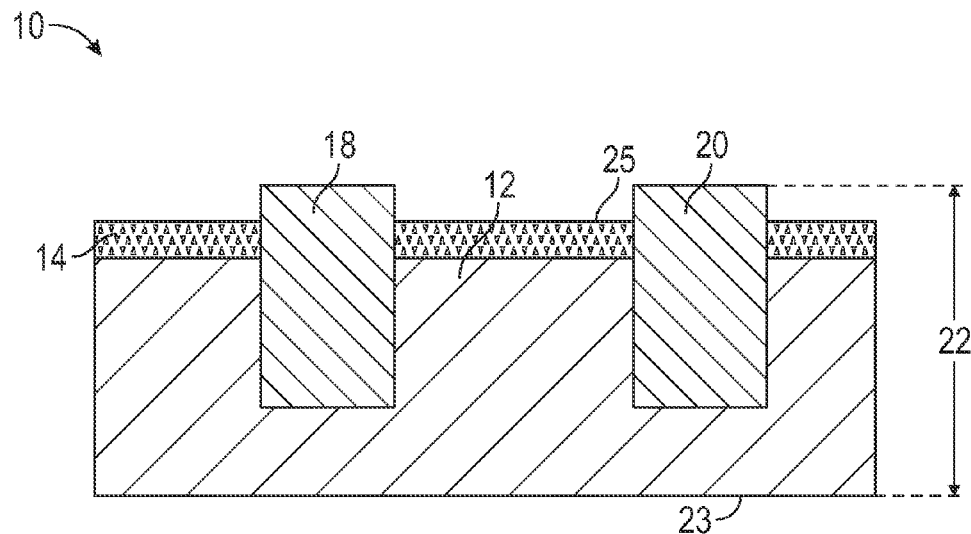
Figure 4:
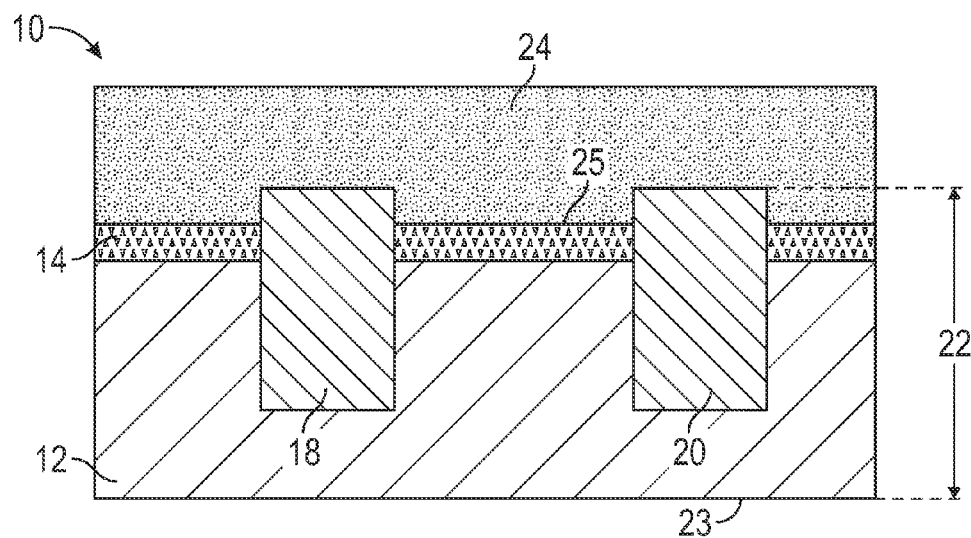

Referring to FIG. 3, the interconnects 18 are extended to about a cap height indicated by reference number 22, such as with electroless copper plating. The cap height 22 may be measured from a first interlayer dielectric base 23, but other reference points may be used for the cap height 22 as long as all heights described herein are measured from a common reference. The cap height 22 is greater than a hard mask upper surface 25, as measured from the first interlayer dielectric base 23, in embodiments where the hard mask 14 is left in place overlying the first interlayer dielectric 12. The cap height 22 is greater than a height of the upper surface of the first interlayer dielectric 12 in embodiments where the hard mask 14 remains in place and also in embodiments where the hard mask 14 is removed from overlying the first interlayer dielectric 12. A first cap material 24 is deposited overlying the exposed hard mask upper surface 25, the first interlayer dielectric 12, and the extended interconnect 18, as illustrated in FIG. 4. The first cap material 24 is an electrically insulating material. In a specific embodiment, the first cap material 24 is silicon carbon nitride, but other electrically insulating materials may be used in alternate embodiments. Silicon carbon nitride can be deposited by chemical vapor deposition using ammonia and polydimethyl silane.

Figure 5:
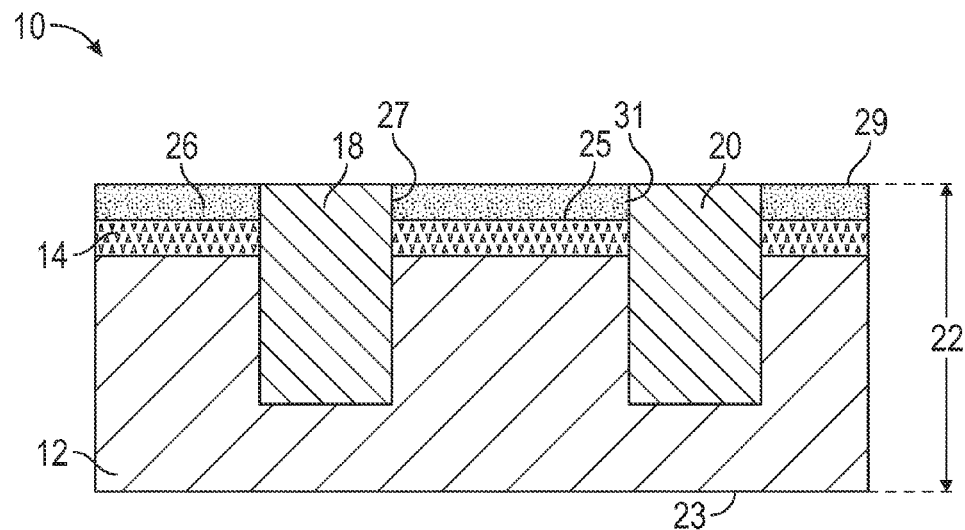
Figure 6:
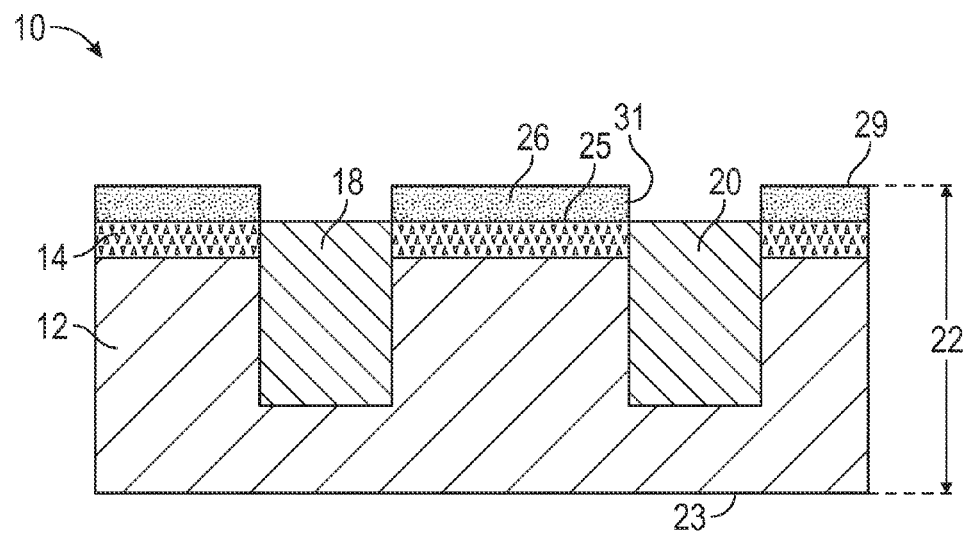

Reference is made to FIG. 5 with continuing reference to FIG. 4. Excess first cap material 24 is removed to form a first cap 26 directly overlying the first interlayer dielectric 12 adjacent to the interconnects 18. As used herein, an item is "directly overlying" a reference point if a vertical line extending from the reference point passes through the item, and a first cap 26 "adjacent" to an interconnect 18 is not directly overlying the interconnect 18. The first cap material 24 is removed to expose the upper surface of the extended interconnect 18, such as with chemical mechanical planarization or a reactive ion etch. As such, the first cap 26 is not directly overlying the interconnect 18, but contacts an interconnect side surface 27 above the hard mask upper surface 25. The first cap 26 has a first cap upper surface 29 and a first cap side surface 31, and the first cap 26 extends above the hard mask upper surface 25 to about a cap height 22. In an exemplary embodiment, the first cap 26 has a first cap thickness of from about 5 nanometers to about 25 nanometers, where the first cap thickness is measured from the hard mask upper surface 25 to a first cap upper surface 29, but other thicknesses are also possible. The interconnects 18 are recessed after the first cap 26 is formed, as illustrated in FIG. 6. The interconnects 18 can be recessed with a wet etch selective to the material of the interconnects 18 over the material of the first cap 26, such as ferric chloride for an exemplary embodiment with a copper interconnect 18 and a silicon carbon nitride first cap 26. In an exemplary embodiment, the interconnects 18 are recessed back to about the same level as the upper surface of the first interlayer dielectric 12 (in embodiments where the hard mask 14 was removed), or to about the same level as the hard mask upper surface 25 (in embodiments where the hard mask 14 was left in place.)

The interconnects 18 are temporarily extended to form the first cap 26, and then recessed, so in an exemplary embodiment there is no seed layer and/or metallic adhesive layer and/or metallic barrier layer with the portion of the interconnect 18 that is recessed. This can reduce the number of etching cycles over methods that recess an interconnect 18 and the associated seed layer and/or adhesive layer below the hard mask upper surface 25. The process of extending and then recessing the interconnects 18 during the formation of the first cap 26 as described above may have some other benefits over production techniques that recess the interconnect 18 below the level of the upper surface of the first interlayer dielectric 12. For example, the depth of the trench formed in the first interlayer dielectric 12 for the interconnects 18 may be reduced compared to a manufacturing process that recesses the interconnects 18 below the level of the upper surface of first interlayer dielectric 12, because the higher final height of the interconnects 18 formed as described herein produces the same cross-sectional area as an interconnect with a deeper (and more difficult to form) trench that has a lower upper surface. The electrical resistance of the interconnects 18 is related to the cross-sectional area of the interconnects 18.

Figure 7:
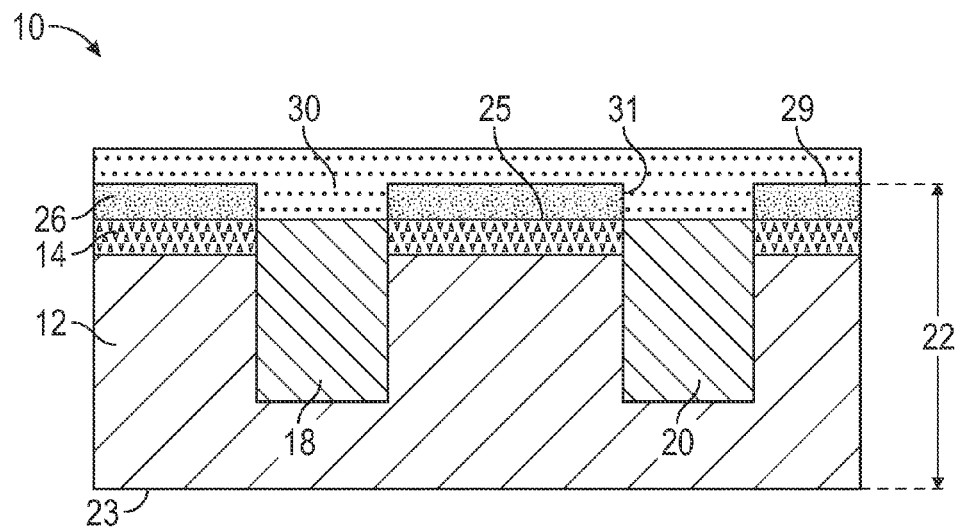

A second cap 30 is formed overlying the interconnect 18, and the second cap 30 may directly contact the interconnect 18, as illustrated in FIG. 7. A side surface of the second cap 30 may also directly contact a first cap side surface 31. The second cap 30 is formed from a second cap material that can prevent or limit the migration of material from the interconnect 18 to materials overlying the second cap 30, such as during subsequent annealing steps. The second cap material is different than the material of the first cap 26 described above. In an exemplary embodiment, the second cap material is silicon nitride that may be deposited by atomic layer deposition or chemical vapor deposition using ammonia and dichlorosilane. The first and second caps 26, 30 are formed from materials with an etch selectivity relative to each other, so the second cap 30 can be selectively removed without removal of the first cap 26. Portions of the second cap 30 may be left in place directly overlying the first cap 26 and also directly overlying the hard mask 14 and the first interlayer dielectric 12 adjacent to the interconnect 18 (as illustrated in FIG. 7), or the second cap 30 may be removed from overlying the first cap 26 adjacent to the interconnect 18 in various embodiments. However, the second cap 30 is left in place directly overlying the interconnect 18 at the stage of the process illustrated in FIG. 7.

Figure 8:
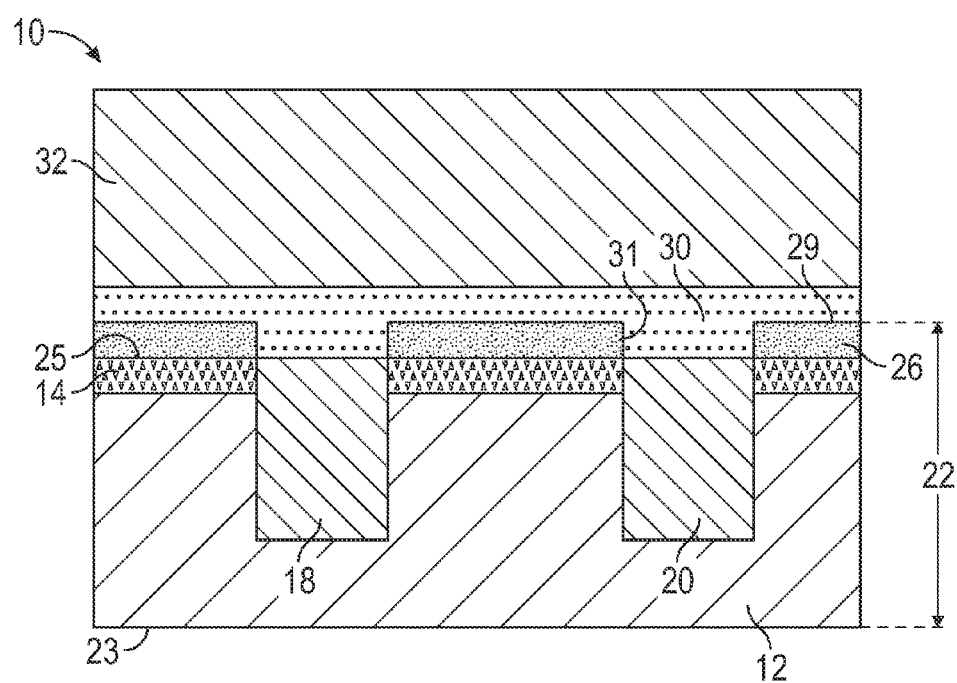

Referring to FIG. 8, a second interlayer dielectric 32 is formed overlying the first interlayer dielectric 12, the interconnects 18, and the first and second caps 26, 30. In an exemplary embodiment, the second interlayer dielectric 32 is a porous low K dielectric material having a dielectric constant (K) of from about 2.0 to about 2.7. For example, a porous organosilicate glass (porous OSG) may be used. OSG may be deposited as a film with a density of about 1.5 grams per cubic centimeter ($g/cm^3$). Porosity may be added to the OSG to produce porous OSG insulating materials with a dielectric constant from about 2.7 to about 2.0 or less, where the void spaces in the pores have a dielectric constant of about 1.0. Porous OSG can be created by adding pore-forming compounds (called "porogens") to silicon containing precursors during the deposition process, and then removing the porogen after the insulating layer is deposited. The porogen may be an organic compound that can be vaporized or otherwise removed from the insulating layer. Examples of silicon-containing precursors include, but are not limited to, tetramethylcyclotetrasiloxane (TMCTS), diethoxymethylsilane (DEMS), dimethyldimethoxysilane (DMDMOS), trimethylsilane (3MS), TEOS, triethoxysilane, di-tert-butoxysilane, and di-tert-butoxydiacetoxysilane. In alternate embodiments, the second interlayer dielectric 32 may include other compounds with different K values.

Figure 9:
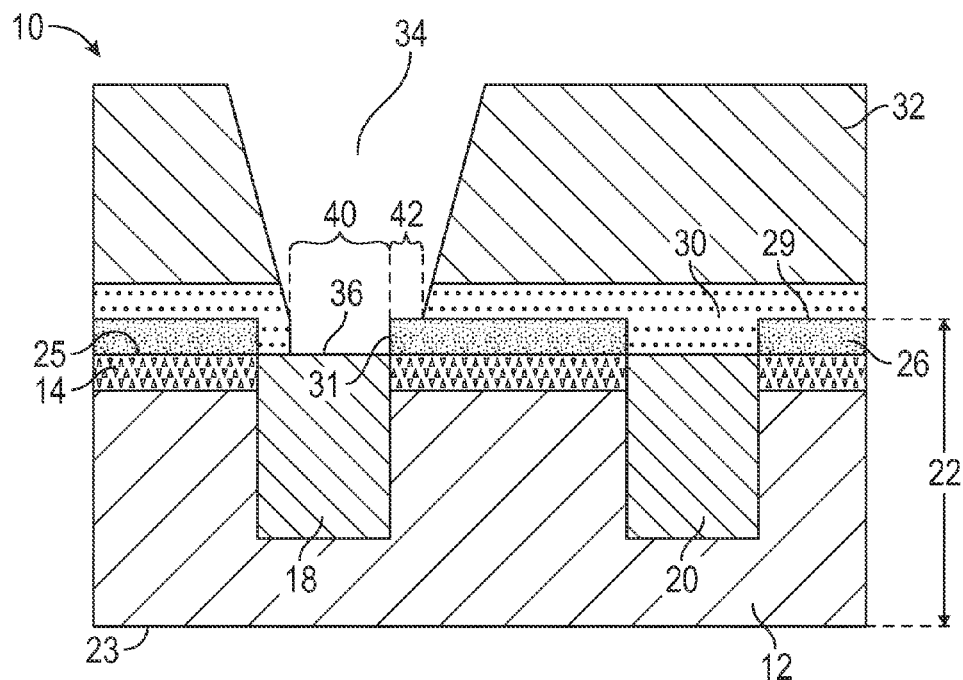

FIG. 9 illustrates the formation of a via 34 through the second interlayer dielectric 32, with the via 34 exposing an interconnect surface 36. The via 34 is formed using known techniques. For example, a mask layer and a photoresist layer (not illustrated) can be patterned for the via 34, and the via 34 can then be formed in the second interlayer dielectric 32 with an anisotropic reactive ion etch technique. The etchant may be selective to the second cap material over the first cap material, as described above, such that formation of the via 34 includes removal of some of the second interlayer dielectric 32 and at least some of the second cap 30 directly overlying the interconnect 18. In some embodiments, the via 34 may be somewhat misaligned due to slight lithography error (as illustrated) such that the via 34 is not perfectly aligned with the interconnect 18, but the via 34 should expose at least a portion of the interconnect surface 36. Suitable etchants to form the via 34 in an exemplary embodiment include fluorine-containing gases such as, for example, silicon hexafluoride, silicon tetrafluoride, nitrogen trifluoride, carbon tetrafluoride, or combinations thereof. The lateral spread of the via 34 may be controlled or limited with an anisotropic reactive ion etch with the addition of a wall polymerization material such as difluoromethane or other hydro-fluoro-carbons. Under circumstances where misalignment occurs, as illustrated in FIG. 9, the misalignment results in the via 34 having a connection portion 40 that directly overlies the interconnect 18 and an overlap portion 42 that directly overlies the first cap 26 and the first interlayer dielectric 12 adjacent to the interconnect 18. The via 34 is formed through the second cap 30, but the etchant used to form the via 34 may be selective to the second cap material over the first cap material such that the via 34 is not formed through the first cap 26.

Figure 10:
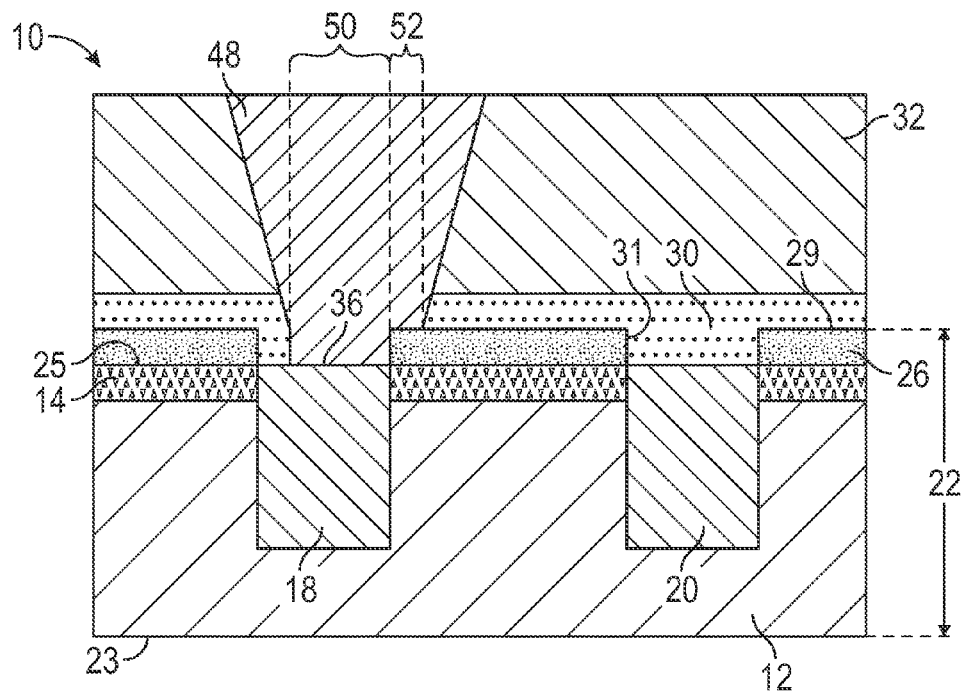

Referring to FIG. 10 with continuing reference to FIG. 9, a contact 48 is formed in the via 34 such that the contact 48 has a connection region 50 and an overlap region 52 associated with the connection portion 40 and the overlap portion 42 described above for the via 34. As such, the first cap 26 is positioned between the contact 48 and the first interlayer dielectric 12 in the overlap region 52 of the contact 48. The contact 48 makes an electrical connection to, and is positioned directly over, the interconnect 18 in the connection region 50 of the contact 48. The first cap 26 serves to self align the contact 48 with the interconnect 18, because any overlap beyond the edge of the interconnect 18 is covered by the first cap 26. In some embodiments, the contact 48 may be properly aligned with the interconnect 18 such that there is no overlap region 52.

The contact 48 is formed from an electrically conductive material. In an exemplary embodiment, the contact 48 includes an adhesion layer, a barrier layer, and a plug (not individually illustrated), which are sequentially deposited. For example, an adhesion layer of titanium is formed by low pressure chemical vapor deposition of titanium pentachloride, a barrier layer of titanium nitride is formed by chemical vapor deposition of titanium tetrabromide and ammonia, and a plug of tungsten is formed by chemical vapor deposition of tungsten hexafluoride and hydrogen. Other types of contacts 48 are also possible, such as copper or other conductive materials. In an exemplary embodiment, the contact 48 has a critical dimension that is about the same as a critical dimension for the interconnect 18, where the critical dimensions are the widths of the contact 48 and interconnect 18 as illustrated.

The shortest distance between the contact 48 and the electrically isolated interconnect 20 is increased by the presence of the first cap 26. As can be seen, if the first cap 26 were not present the shortest distance between the contact 48 and the electrically isolated interconnect 20 would be a horizontal line along the hard mask upper surface 25. However, the shortest distance with the first cap 26 is a diagonal line that is approximately the hypotenuse of a triangle formed by the corner of the contact 48 nearest to the electrically isolated interconnect 20, the corner of the electrically isolated interconnect 20 nearest to the contact 48, and the point where the contact 48 would have intersected the hard mask 14 if the first cap 26 were not present. This diagonal line is longer than the horizontal line along the hard mask upper surface 25, so the first cap 26 increases the shortest distance between the contact 48 and the electrically isolated interconnect 20. This increased distance can reduce the occurrence of shorts, as described above.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
    forming an interconnect in a first interlayer dielectric;
    forming a first cap overlying the first interlayer dielectric adjacent to the interconnect;
    recessing the interconnect after forming the first cap;
    forming a second cap overlying the first cap layer and the interconnect after recessing the interconnect;
    forming a second interlayer dielectric overlying the first interlayer dielectric, the interconnect, the first cap, and the second cap; forming a contact through the second interlayer dielectric, wherein the contact comprises an overlap region and a connection region, wherein the overlap region directly overlies the first interlayer dielectric adjacent to the interconnect and the connection region directly contacts the interconnect, wherein the first cap is positioned between the overlap region of the contact and the first interlayer dielectric, and after forming the contact the second cap layer is directly in contact with a portion of the interconnect surface.

2. The method of claim 1 further comprising:
    forming a via through the second interlayer dielectric and through the second cap, wherein the first cap underlies at least a portion of the via; and
    wherein forming the contact comprises forming the contact within the via.

3. The method of claim 2 wherein forming the the second cap comprises forming the second cap from a different material than the first cap.

4. The method of claim 1 further comprising:
    extending the interconnect to a cap height prior to forming the first cap.

5. The method of claim 4 wherein forming the first cap comprises:
    depositing a first cap material overlying the interconnect and the first interlayer dielectric after extending the interconnect to the cap height; and
    removing the first cap material to the cap height such that the interconnect is exposed.

6. The method of claim 5 wherein:
    recessing the interconnect comprises recessing the interconnect after removing the first cap material to the cap height.

7. The method of claim 1 wherein forming the interconnect comprises forming a plurality of interconnects having a pitch of about 50 nanometers or less.

8. The method of claim 2 wherein:
    forming the via comprises forming the via such that the second cap directly contacts the interconnect.

9. The method of claim 1 wherein forming the first cap comprises forming the first cap with a first cap thickness of from about 5 to about 25 nanometers.

10. A method of producing an integrated circuit comprising:
    forming an interconnect in a first interlayer dielectric;
    extending the interconnect to a cap height, wherein the cap height is higher than a first interlayer dielectric upper surface
    forming a first cap overlying the first interlayer dielectric and adjacent to the interconnect after extending the interconnect to the cap height, wherein the first cap comprises a first cap material, wherein forming the first cap comprises depositing the first cap material overlying the interconnect and the first interlayer dielectric after extending the interconnect to the cap height and removing the first cap material such that the interconnect is exposed;
    recessing the interconnect after removing the first cap material and exposing the interconnect;
    forming a second cap overlying the interconnect after recessing the interconnect, wherein the second cap comprises a second cap material different than the first cap material;
    forming a second interlayer dielectric overlying the first cap and the second cap; and forming a contact through the second interlayer dielectric, wherein the contact is electrically coupled to the interconnect.

11. The method of claim 10 wherein:
forming the second cap comprises forming the second cap in direct contact with the interconnect.

12. The method of claim 10 wherein extending the interconnect to the cap height comprises extending the interconnect to from about 5 nanometers to about 25 nanometers above the first interlayer dielectric upper surface.

13. The method of claim 10 wherein forming the contact comprises forming the contact in direct contact with the first cap in an overlap region, wherein the overlap region directly overlies the first interlayer dielectric adjacent to the interconnect.

14. The method of claim 10 further comprising:
etching a via through the second interlayer dielectric and through the second cap, wherein an etchant used for etching the via is selective to a second cap material over a first cap material; and
wherein forming the contact comprises forming the contact within the via.

15. The method of claim 10 wherein forming the second cap comprises forming the second cap from the second cap material wherein there is an etch selectivity between the first cap material and the second cap material.

16. The method of claim 10 wherein forming the first cap comprises depositing silicon carbon nitride.

17. The method of claim 10 wherein forming the second cap comprises depositing silicon nitride.

18. The method of claim 10 wherein forming the interconnect comprises forming a plurality of interconnects having a pitch of about 50 nanometers or less.

19. The method of claim 10 wherein forming the second interlayer dielectric comprises forming a porous low K dielectric material having a dielectric K value of from about 2.0 to about 2.7.

20. An integrated circuit comprising:
an interconnect positioned within a first interlayer dielectric, wherein the interconnect comprises an interconnect surface;
a first cap overlying the first interlayer dielectric adjacent to the interconnect, wherein the first cap comprises a first cap upper surface, and wherein the interconnect surface is recessed below the first cap upper surface;
a second cap overlying at least a portion of the first cap, wherein the second cap directly contacts the interconnect surface;
a second interlayer dielectric overlying the first cap, the second cap, and the first interlayer dielectric; and
a contact positioned within the second interlayer dielectric, wherein the contact comprises an overlap region and a connection region, wherein the connection region of the contact is electrically coupled to the interconnect, wherein the overlap region of the contact directly overlies the first interlayer dielectric adjacent to the interconnect, and wherein the first cap is positioned between the overlap region of the contact and the first interlayer dielectric.

* * * * *